United States Patent
Wu

(10) Patent No.: US 9,557,638 B2
(45) Date of Patent: Jan. 31, 2017

(54) METHOD FOR MANUFACTURING PHOTO MASK AND PHOTO MASK MANUFACTURED WITH SAME

(71) Applicant: Shenzhen China Star Optoelectronics Technology Co., Ltd., Shenzhen, Guangdong (CN)

(72) Inventor: Taipi Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 240 days.

(21) Appl. No.: 14/349,139

(22) PCT Filed: Jun. 26, 2013

(86) PCT No.: PCT/CN2013/077941
§ 371 (c)(1),
(2) Date: Apr. 2, 2014

(87) PCT Pub. No.: WO2014/169524
PCT Pub. Date: Oct. 23, 2014

(65) Prior Publication Data
US 2016/0011504 A1  Jan. 14, 2016

(30) Foreign Application Priority Data
Apr. 19, 2013 (CN) .......................... 2013 1 0138465

(51) Int. Cl.
*G03F 1/80* (2012.01)
*G03F 1/50* (2012.01)

(52) U.S. Cl.
CPC .. *G03F 1/80* (2013.01); *G03F 1/50* (2013.01)

(58) Field of Classification Search
CPC ..................................... G03F 1/80; G03F 1/50
See application file for complete search history.

(56) References Cited

U.S. PATENT DOCUMENTS

| 2002/0025406 A1 | 2/2002 | Kitazume |
| 2004/0142108 A1* | 7/2004 | Atobe .................. C23C 14/042 427/282 |

(Continued)

FOREIGN PATENT DOCUMENTS

| CN | 102766844 A | 11/2012 |
| CN | 102776473 A | 11/2012 |
| JP | 2008-208426 A | 9/2008 |

*Primary Examiner* — Nadine Norton
*Assistant Examiner* — Mahmoud Dahimene
(74) *Attorney, Agent, or Firm* — Andrew C. Cheng

(57) ABSTRACT

Disclosed are a method for manufacturing a photo mask and a photo mask manufactured with the method. The method includes (1) providing a partially finished photo mask, which has effective open areas and ineffective areas located around the effective open areas and (2) applying a half-etching process to form recesses in the ineffective areas. With the recesses formed through a half-etching process in the ineffective areas located around the effective open areas, a mass difference between the effective open areas and the ineffective areas is reduced so that in the process of attracting the photo mask, inconsistent sequence of attraction caused by a great mass difference between the effective open areas and the ineffective areas can be eliminated to thereby ensure that the effective open areas of the photo mask can be laid completely flat on a substrate at predetermined locations and thus ensure the preciseness of a deposited pattern.

4 Claims, 7 Drawing Sheets

(56) References Cited

U.S. PATENT DOCUMENTS

2005/0019968 A1\* 1/2005 Kuwahara ............. C23C 14/042
  438/26
2005/0167395 A1 8/2005 Lee, II
2012/0156594 A1\* 6/2012 Lee ........................... G03F 1/50
  430/5

\* cited by examiner

1 — providing a partially finished photo mask, wherein the partially finished photo mask comprises a plurality of effective open areas and ineffective areas located around the effective open areas 2 — applying a half-etching process to form recesses in the ineffective areas

Fig. 5

METHOD FOR MANUFACTURING PHOTO MASK AND PHOTO MASK MANUFACTURED WITH SAME

BACKGROUND OF THE INVENTION

1. Field of the Invention

The present invention relates to the field of liquid crystal display, and in particular to a method for manufacturing a photo mask for vapor deposition of organic light-emitting display panel and a photo mask manufactured with the method.

2. The Related Arts

Flat panel display devices have a variety of advantages, such as thin device body, low power consumption, and being free of radiation, and are thus widely used. The flat panel display devices that are currently available include liquid crystal displays (LCDs) and organic light-emitting displays (OLEDs).

Referring to FIG. 1, a currently available organic light-emitting display generally comprises: a glass substrate 900, a transparent conductive layer 902 formed on the glass substrate 900, a hole transporting layer (HTL) 904 formed on the transparent conductive layer 902, an organic emitting material layer (EML) 906 formed on the hole transporting layer 904, and an electron transporting layer (ETL) 908 formed on the organic emitting material layer 906, and a cathode 909 formed on the electron transporting layer 908, in which the transparent conductive layer 902 serves as an anode of the organic light-emitting display and is generally made of indium tin oxide (ITO). When the organic light-emitting display is subjected to a forward bias caused by a direct current, the energy of the externally applied voltage drives electrons and holes to inject into the organic light-emitting display from the cathode 909 and the anode 902 respectively. When the electrons and the holes meet and re-combine with each other during transportation, the so-called "electron-hole capture" occurs. When the chemical molecules of the organic emitting material layer 906 are excited by the external energy, if the electron spin thereof is paired with the ground state electron, then it is referred to as "singlet" and light released therefrom is fluorescence; and if the excited electron and the ground state electron are of electron spins that are not paired and are parallel to each other, then it is referred to as "triplet" and the light released therefrom is phosphorescence. When the state of an electron goes from an excited, high energy state back to a stable, low energy state, energy will be released in the form of light emission or heat dissipation, of which some of the photons are used for the function of displaying.

In a manufacturing process of an organic light-emitting display, vapor deposition is commonly adopted, wherein vapor-deposited area is defined by arranging vapor deposition apertures in photo masks that correspond to predetermined patterns to be formed in the layers, whereby desired patterns can be formed on the substrate.

Vapor deposition is often carried out in a vacuum chamber with a bottom surface of a substrate serving as a deposition surface. A photo mask is placed between the deposition surface and a vapor source. To carry out vapor deposition, the vapor source is heated to evaporate a deposition material to allow the material to pass through the vapor deposition apertures of the photo mask and attach to the deposition surface thereby forming a desired pattern on the deposition surface.

Referring to FIG. 2, a schematic view of the structure of a conventional photo mask is shown, which is generally made of a material, such as glass, quartz, magnesium fluoride, and calcium fluoride, of which the thermal expansion coefficient is identical or less than that of a processed substrate and comprises a plurality of working units 11 arranged in an array. In a working unit 11, a shielding layer 12 of which the thickness is around 50-500 µm is formed through inwards recessing and the shielding layer 12 is provided with through apertures that are formed to correspond to a predetermined pattern to serve as vapor deposition apertures 13. To prevent the working unit 11 from deformation that leads to deviation of preciseness of deposition, the working unit 11 is provided, along a perimeter thereof, with a rib 14 that has a greater thickness of approximately 50 µm to several centimeters. To use, the photo mask is retained under the deposition surface of the processed substrate by a support mechanism (not shown). However, since it is thin, it is difficult to position and fix, the installation being more time-consuming and the manufacture cost being relatively high.

To overcome the above-discussed problem, a photo mask that is made of a magnetic material and can be attracted and fixed by magnetism. As shown in FIGS. 3 and 4, the photo mask is provided with a plurality of effective open areas 100 and ineffective areas 300 between the effective open areas 100. The effective open areas 100 are provided with vapor deposition apertures (not shown) formed thereon to correspond to a predetermined pattern. Before the conduction of vapor deposition, the effective open areas 100 of the photo mask are attracted by magnetic plates (not shown) so that the effective open areas 100 are laid flat on a substrate to eliminate shadow effect. The sizes of the effective open areas 100 are arranged according to an effective area of the substrate (not shown). However, since the effective open areas 100 are provided with a plurality of vapor deposition apertures, the mass of an effective open area 100 and the mass of an ineffective area between two effective open areas 100 are different, whereby during the magnetic attraction of the photo mask, the sequences that the areas of different masses are attracted are different and this leads to that the effective open areas 100 may not be effectively laid flat on predetermined positions, resulting in positional shifts of pixels.

SUMMARY OF THE INVENTION

An object of the present invention is to provide a method for manufacturing a photo mask, which applies half etching to an ineffective area in order to reduce mass difference between an effective open area and an adjacent ineffective area of the photo mask so manufactured thereby effectively eliminating the problem of inconsistent attraction sequence caused by a great mass difference between the effective open area and the ineffective area during the attraction of the photo mask.

Another object of the present invention is to provide a photo mask, which comprises a recess formed in an ineffective area to reduce a mass difference between an effective open area and an adjacent ineffective area so as to ensure, during the attraction of the photo mask, the effective open area of the photo mask is laid completely flat at a predetermined position on a substrate thereby ensuring the preciseness of a deposited pattern.

To achieve the above object, the present invention provides a method for manufacturing a photo mask, which comprises the following steps:

(1) providing a partially finished photo mask, wherein the partially finished photo mask comprises a plurality of effective open areas and ineffective areas located around the effective open areas; and (2) applying a half-etching process to form recesses in the ineffective areas.

Mass of the ineffective areas is reduced in step (2).

Through the reduction of the mass of the ineffective areas in step (2), the ineffective areas that have the same surface area as that of the effective open areas are made to have the same mass as that of the effective open areas.

In step (1), the effective open areas are provided with a plurality of vapor deposition apertures.

The partially finished photo mask is made of a magnetic material and comprises a full sheet mask or a divide mask.

The present invention also provides a method for manufacturing a photo mask, which comprises the following steps:

(1) providing a partially finished photo mask, wherein the partially finished photo mask comprises a plurality of effective open areas and ineffective areas located around the effective open areas; and (2) applying a half-etching process to form recesses 242 in the ineffective areas; and wherein mass of the ineffective areas is reduced in step (2);

wherein through the reduction of the mass of the ineffective areas in step (2), the ineffective areas that have the same surface area as that of the effective open areas are made to have the same mass as that of the effective open areas;

wherein in step (1), the effective open areas are provided with a plurality of vapor deposition apertures; and wherein the partially finished photo mask is made of a magnetic material and comprises a full sheet mask or a divide mask.

The present invention further provides a photo mask, which comprises a plurality of effective open areas and ineffective areas located around the effective open areas. The ineffective areas comprise recesses formed therein.

The recesses reduce mass of the ineffective areas, whereby the ineffective areas that have the same surface area as that of the effective open areas are made to have the same mass as that of the effective open areas.

The effective open areas are provided with a plurality of vapor deposition apertures.

The recesses are formed through application of a half-etching process.

The photo mask is made of a magnetic material and comprises a full sheet mask or a divide mask.

The efficacy of the present invention is that the present invention provides a method for manufacturing a photo mask and a photo mask manufactured with the method, wherein with recesses formed through a half-etching process in ineffective areas that are located around effective open areas, a mass difference between the effective open areas and the ineffective areas is reduced so that in the process of attracting the photo mask, inconsistent sequence of attraction caused by a great mass difference between the effective open areas and the ineffective areas can be eliminated to thereby ensure that the effective open areas of the photo mask can be laid completely flat on a substrate (not shown) at predetermined locations and thus ensure the preciseness of a deposited pattern.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing:

FIG. 5 is a flow chart illustrating a method for manufacturing a photo mask according to the present invention;

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
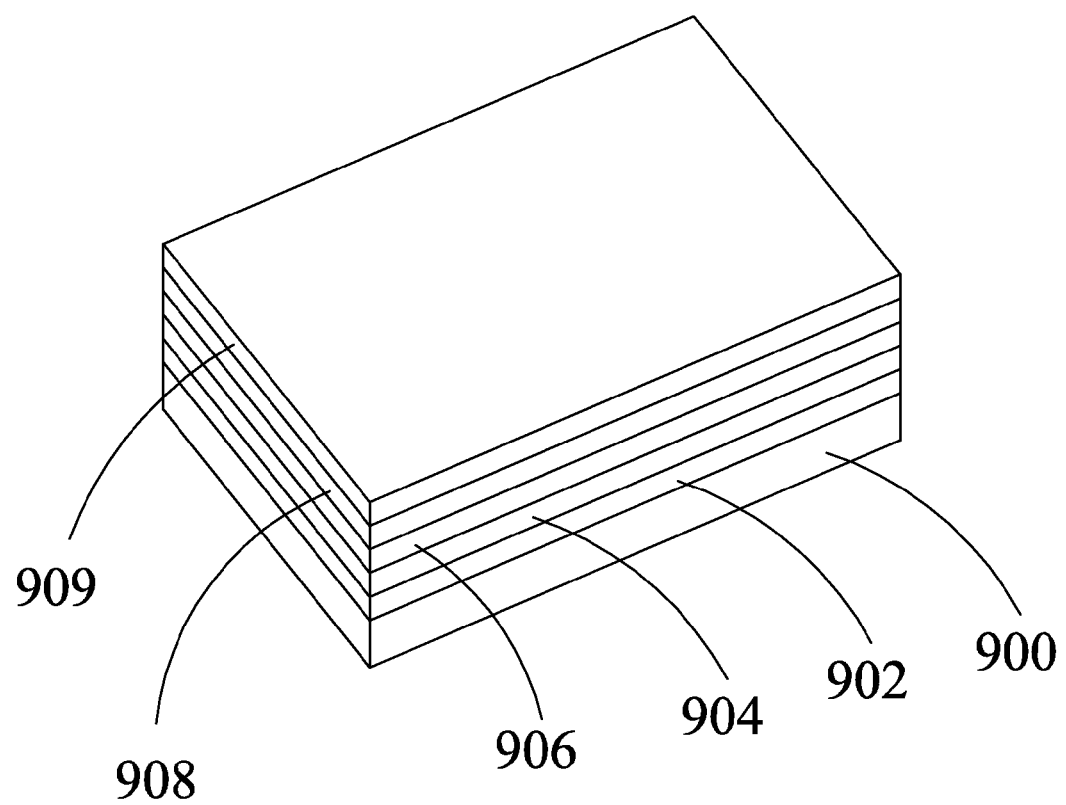
FIG. 1 is a schematic perspective view showing the structure of a conventional organic light-emitting display.
Figure 2:
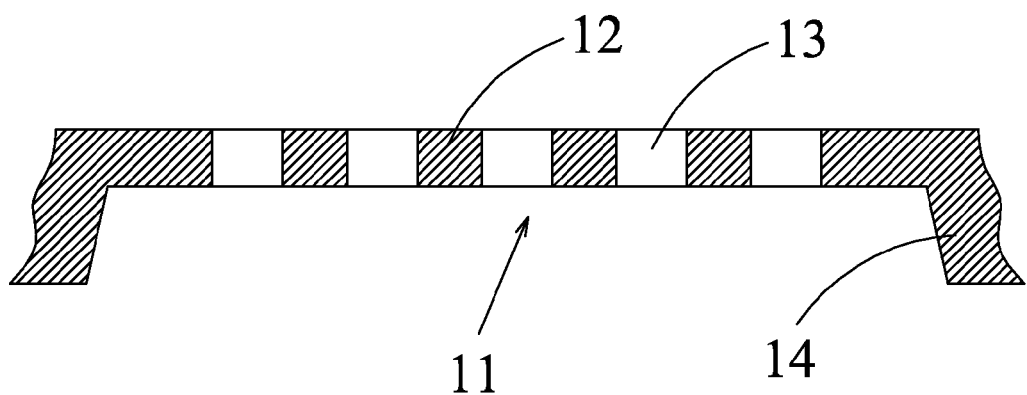
FIG. 2 is a schematic cross-sectional view showing a portion of a conventional photo mask.
Figure 3:
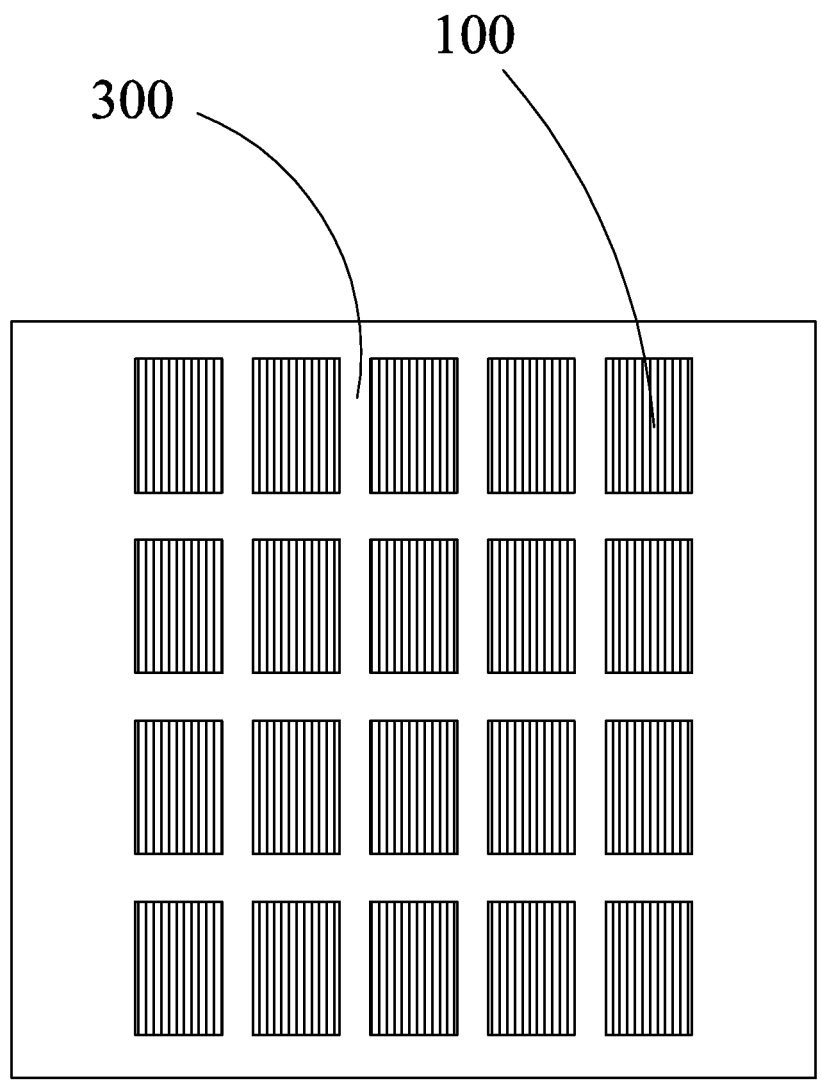
FIG. 3 is a schematic plan view showing another conventional photo mask.
Figure 4:
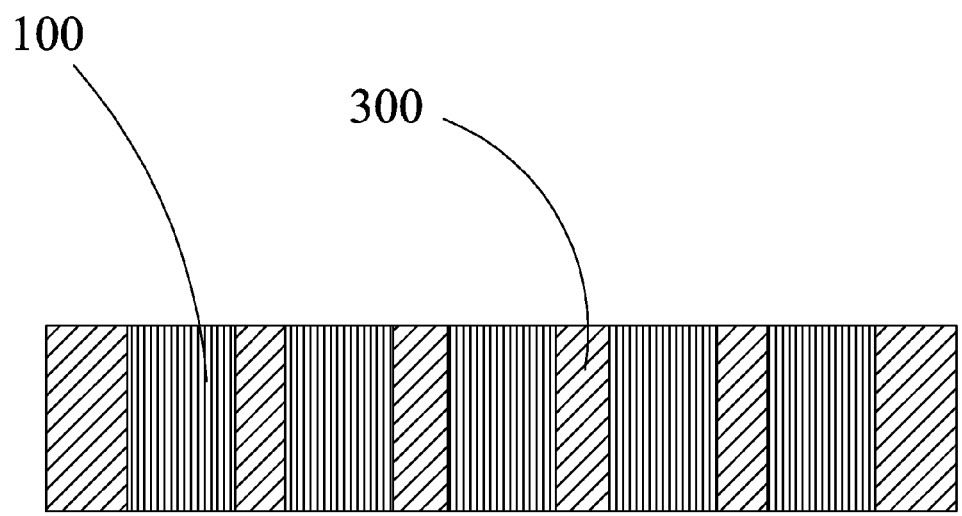
FIG. 4 is a cross-sectional view of the photo mask shown in FIG. 3.
Figure 6:
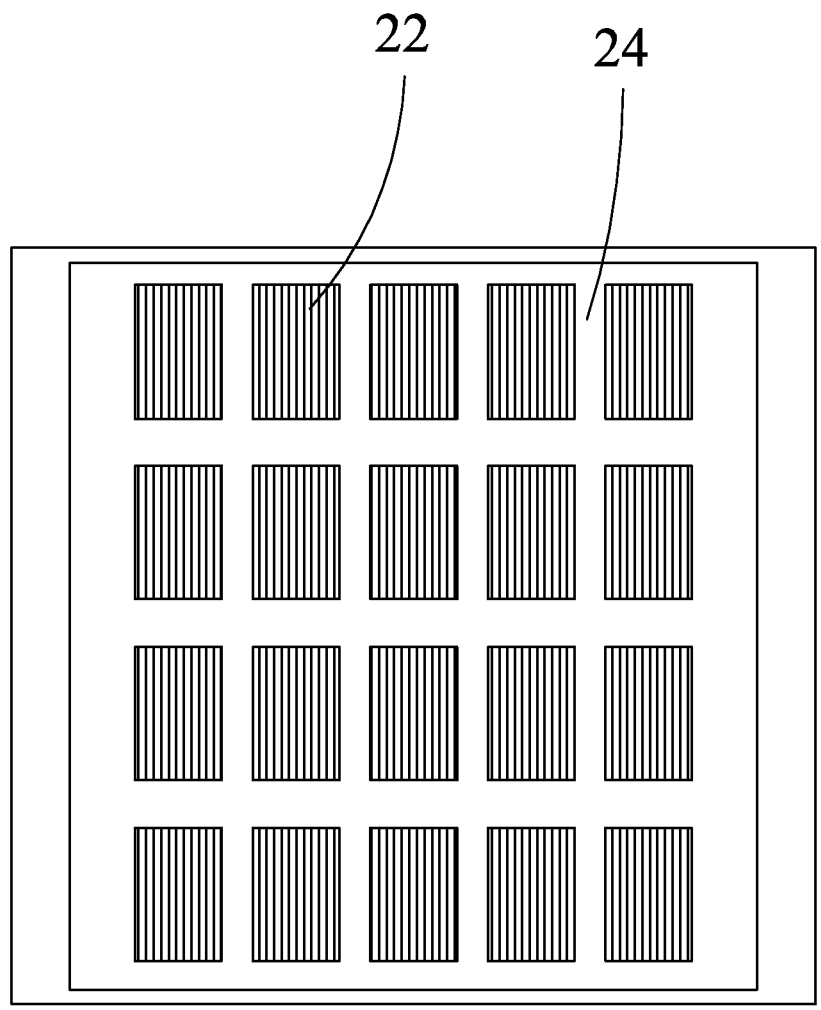
FIG. 6 is a schematic plan view showing a photo mask according to the present invention.
Figure 7:
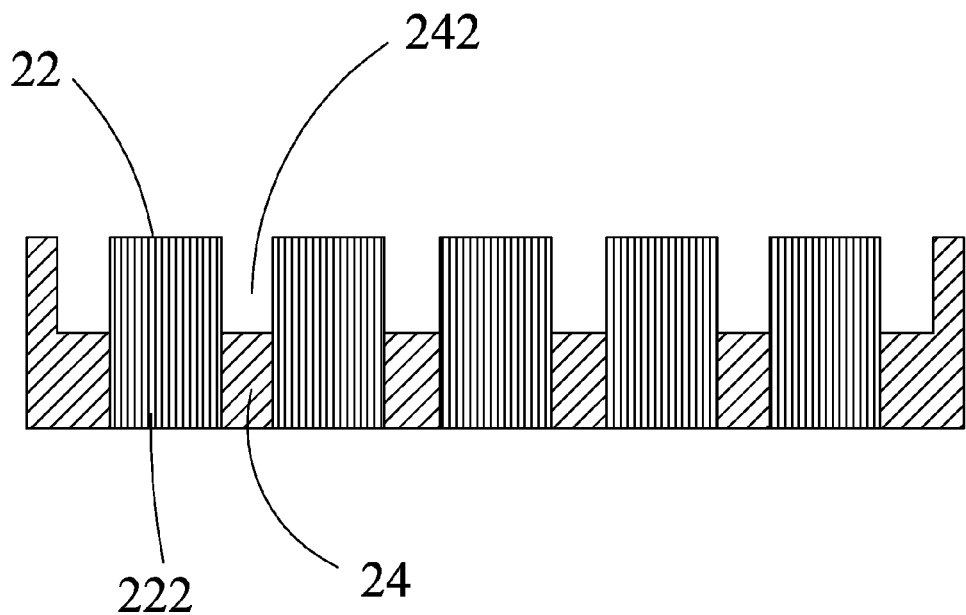
FIG. 7 is a schematic cross-sectional view showing the photo mask according to the present invention.

Referring to FIGS. 5-7, the present invention provides a method for manufacturing a photo mask, which comprises the following steps:

Step 1: providing a partially finished photo mask, wherein the partially finished photo mask comprises a plurality of effective open areas 22 and ineffective areas 24 located around the effective open areas 22.

The partially finished photo mask is provided by using a known technique and is made of a magnetic material. The partially finished photo mask can be for example a full sheet mask and a divide mask.

The effective open areas 22 are provided with a plurality of vapor deposition apertures 222 and the vapor deposition apertures 222 are arranged according to a desired deposition pattern.

Step 2: applying a half-etching process to form recesses 242 in the ineffective areas 24.

With the application of the half-etching process to form the recesses 242 in the ineffective areas 24, the mass of the ineffective areas 24 is reduced. The formation of the recesses 242 is realized through the application of a half-etching process, which can be carried out with a simple operation and allows easy control of the depth of the recesses 242 in order to achieve an effective reduction of the mass difference between an open area 22 and an ineffective area 24 adjacent thereto. To achieve the reduction of the mass difference between an effective open area 22 and an ineffective area 24 adjacent thereto, the ineffective area 24 that has a surface area substantially identical to the effective open area 22 is made to have a mass that is substantially identical to the mass of the effective open area 22. Preferably, the ineffective area 24 that has the same surface area as that of the effective open area 22 has the same mass as that of the effective open area 22. Thus, in the process of attracting the photo mask, inconsistent sequence of attraction caused by a great mass difference between the effective open areas 22 and the ineffective areas 24 can be eliminated so as to ensure that the effective open areas 22 of the photo mask can be laid completely flat on a substrate (not shown) at predetermined locations.

To use, the photo mask is attracted by a magnetic board to attach to the substrate. Since the mass difference between the effective open areas 22 and the ineffective areas 24 of the photo mask according to the present invention is reduced, the effective open areas 22 can be laid completely flat on the substrate at the predetermined locations. A deposition material is evaporated through heating a deposition source and passes through the vapor deposition apertures 222 of the photo mask to attach to a deposition surface of the substrate thereby forming precisely a desired pattern on the deposition surface of the substrate.

Referring to FIGS. 6 and 7, the present invention also provides a photo mask, which comprises a plurality of effective open areas 22 and ineffective areas 24 located around the effective open areas 22. The ineffective areas 24 comprise recesses 242 formed therein.

In the instant embodiment, the recesses 242 are formed through application of a half-etching process, which can be carried out with a simple operation and allows easy control of the depth of the recesses 242 in order to achieve an effective reduction of the mass difference between an open area 22 and an ineffective area 24 adjacent thereto.

The photo mask is made of a magnetic material. The photo mask can be for example a full sheet mask and a divide mask.

The effective open areas 22 are provided with a plurality of vapor deposition apertures 222 and the vapor deposition apertures 222 are arranged according to a desired deposition pattern.

With the formation of the recesses 242, reduction of mass difference between an effective open area 22 and an ineffective area 24 adjacent thereto can be realized. Preferably, the ineffective area 24 that has a surface area substantially identical to the effective open area 22 is made to have a mass that is substantially identical to the mass of the effective open area 22. It is more preferable that the ineffective area 24 that has the same surface area as that of the effective open area 22 has the same mass as that of the effective open area 22. Thus, in the process of attracting the photo mask, inconsistent sequence of attraction caused by a great mass difference between the effective open areas 22 and the ineffective areas 24 can be eliminated so as to ensure that the effective open areas 22 of the photo mask can laid completely flat on a substrate (not shown) at predetermined locations.

To use, the photo mask is attracted by a magnetic board to attach to the substrate. Since the mass difference between the effective open areas 22 and the ineffective areas 24 of the photo mask according to the present invention is reduced, the effective open areas 22 can be laid completely flat on the substrate at the predetermined locations. A deposition material is evaporated through heating a deposition source and passes through the vapor deposition apertures 222 of the photo mask to attach to a deposition surface of the substrate thereby forming precisely a desired pattern on the deposition surface of the substrate.

In summary, the present invention provides a method for manufacturing a photo mask and a photo mask manufactured with the method, wherein with recesses formed through a half-etching process in ineffective areas that are located around effective open areas, a mass difference between the effective open areas and the ineffective areas is reduced so that in the process of attracting the photo mask, inconsistent sequence of attraction caused by a great mass difference between the effective open areas and the ineffective areas can be eliminated to thereby ensure that the effective open areas of the photo mask can be laid completely flat on a substrate (not shown) at predetermined locations and thus ensure the preciseness of a deposited pattern.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a mask, comprising the following steps:
   (1) providing a partially finished mask, wherein the partially finished mask is made of a material and comprises a plurality of effective open areas each of which comprises vapor deposition apertures formed therein in such a manner that the vapor deposition apertures are spaced from each other and extend, in a given direction, through a first part of the material of the partially finished mask that constitutes the effective open area to form hollow openings extending through the first part of the material for allowing a deposition material to pass therethrough and ineffective areas located around the effective open areas and comprising a second part of the material such that solid portions of the second part of the material are respectively located adjacent to the effective open areas; and
   (2) applying an etching process to partially remove the solid portions so as to form recesses in the ineffective areas, wherein the partial removal of the solid portions is such that the ineffective areas that have the same surface area as that of the effective open areas are made to have substantially the same mass as that of the effective open areas.

2. The method for manufacturing a mask as claimed in claim 1, wherein mass of the ineffective areas is reduced in step (2) through the partial removal of the solid portions of the ineffective areas.

3. The method for manufacturing a mask as claimed in claim 1, wherein the partially finished mask is made of a magnetic material and comprises a full sheet mask or a divide mask.

4. A method for manufacturing a mask, comprising the following steps:
   (1) providing a partially finished mask, wherein the partially finished mask is made of a material and comprises a plurality of effective open areas each of which comprises vapor deposition apertures formed therein in such a manner that the vapor deposition apertures are spaced from each other and extend, in a given direction, through a first part of the material of the partially finished mask that constitutes the effective open area to form hollow openings extending through the first part of the material for allowing a deposition material to pass therethrough and ineffective areas located around the effective open areas and comprising a second part of the material such that solid portions of the second part of the material are respectively located adjacent to the effective open areas; and
   (2) applying an etching process to partially remove the solid portions so as to form recesses in the ineffective areas, wherein the partial removal of the solid portions is such that the ineffective areas that have the same surface area as that of the effective open areas are made to have substantially the same mass as that of the effective open areas; and wherein mass of the ineffective areas is reduced in step (2) through the partial removal of the solid portions of the ineffective areas; and wherein the partially finished mask is made of a magnetic material and comprises a full sheet mask or a divide mask.

* * * * *